(12) United States Patent
Gribb

(10) Patent No.: US 7,157,702 B2
(45) Date of Patent: Jan. 2, 2007

(54) HIGH RESOLUTION ATOM PROBE

(75) Inventor: Tye Travis Gribb, Madison, WI (US)

(73) Assignee: Imago Scientific Instruments Corporation, Madison, WI (US)

( * ) Notice: Subject to any disclaimer, the term of this patent is extended or adjusted under 35 U.S.C. 154(b) by 0 days.

(21) Appl. No.: 10/559,733

(22) PCT Filed: May 26, 2004

(86) PCT No.: PCT/US2004/016590

§ 371 (c)(1),
(2), (4) Date: Dec. 6, 2005

(87) PCT Pub. No.: WO2004/111604

PCT Pub. Date: Dec. 23, 2004

(65) Prior Publication Data

US 2006/0113470 A1    Jun. 1, 2006

Related U.S. Application Data

(60) Provisional application No. 60/476,348, filed on Jun. 6, 2003.

(51) Int. Cl.
G21K 7/00 (2006.01)
G21K 5/10 (2006.01)
G21K 5/08 (2006.01)

(52) U.S. Cl. .................. 250/310; 250/440.11; 250/306; 250/307; 250/309; 250/311; 324/451

(58) Field of Classification Search .................... None
See application file for complete search history.

(56) References Cited

U.S. PATENT DOCUMENTS 5,440,124 A * 8/1995 Kelly et al. ................. 250/309

* cited by examiner

Primary Examiner—Nikita Wells
Assistant Examiner—Zia R. Hashmi
(74) Attorney, Agent, or Firm—Perkins Coie LLP

(57) ABSTRACT

A three dimensional atom probe comprising a sharp specimen (10) coupled to a mounting means (12) where emission of charged particles is caused by application of a potential to the specimen tip (10) such that charged particles are influenced by filtering electrodes (206, 204) before impingement on a detection screen (202).

30 Claims, 2 Drawing Sheets

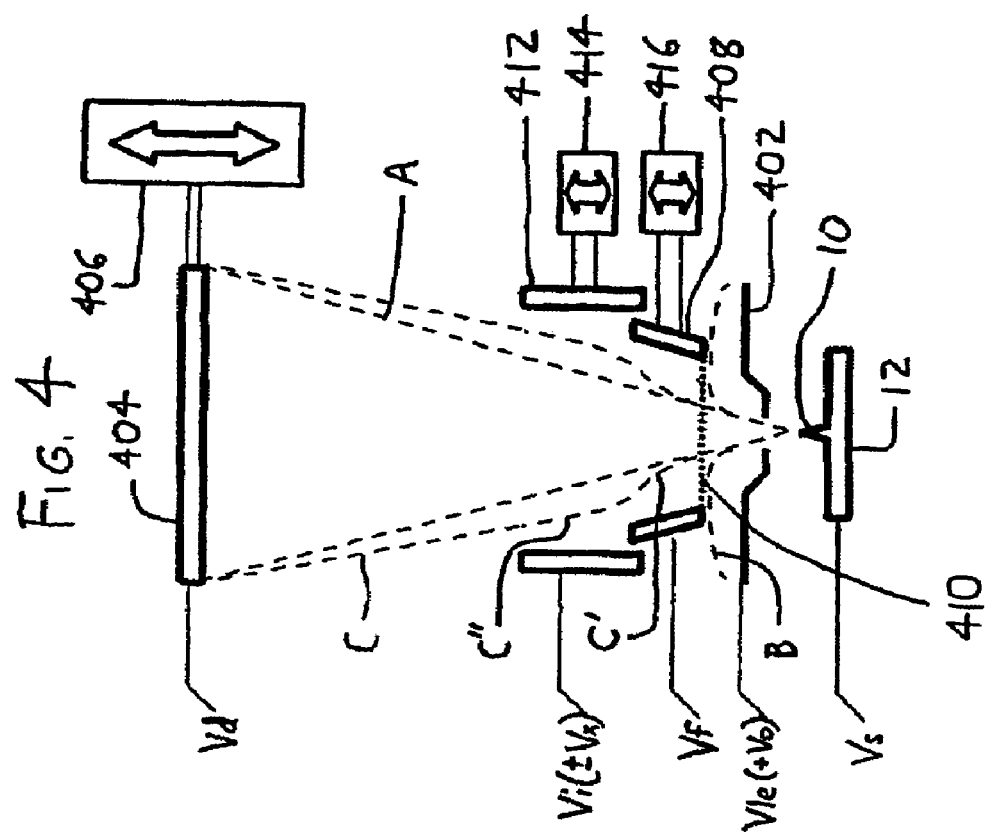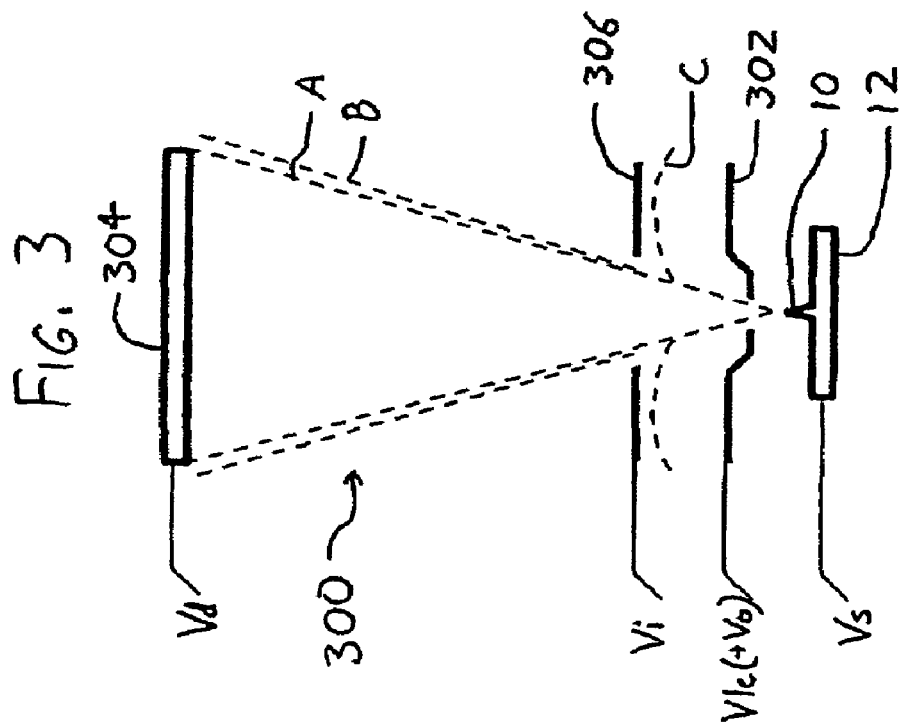

HIGH RESOLUTION ATOM PROBE

CROSS-REFERENCE TO RELATED APPLICATIONS

This application is a U.S. national phase application of PCT/US2004/016590, filed May 26, 2004, which claims the benefit of U.S. Provisional Patent Application Ser. No. 60/476,348, entitled "HIGH RESOLUTION ATOM PROBE," filed Jun. 6, 2003, which is incorporated herein in its entirety by reference.

FIELD OF THE INVENTION

This document concerns an invention relating generally to the field of atom probe microscopy.

BACKGROUND OF THE INVENTION

The three-dimensional atom probe (3DAP), also known as a position-sensitive atom probe (POSAP), is a device which allows specimens to be analyzed on an atomic level. Typical atom probes operate by (usually positively) ionizing and extracting atoms from a specimen's surface. FIG. 1 presents a schematic view of an exemplary atom probe of a more recent type, wherein the locations and identities of the component atoms of a specimen 10 are determined by situating the specimen 10 opposite a position-sensitive detector 100 (generally a microchannel plate and delay line anode). A local electrode 102 is then situated between the specimen 10 and detector 100. The specimen 10 is generally charged to some datum potential Vs (generally a positive voltage between 500 and 20,000 V), and the local electrode 102 is held to some attractive potential Vle. Where the datum potential Vs is positive, the local electrode 102 is often set to ground (0 V). The detector 100 is also charged to a potential Vd which is attractive with respect to Vs. As a result, the atoms of the specimen 10 are attracted towards the local electrode 102 and detector 100 in accordance with their proximity from the local electrode 100 and detector 100 (i.e., atoms of the specimen 10 which are closer to the local electrode 100 are more strongly attracted). However, the magnitude of Vs–Vle—i.e., the attractive force exerted between the local electrode 102 and the specimen 10—is held at some fraction of the value necessary to ionize atoms of the specimen 10.

When it is then desired to ionize atoms, an additional attractive potential—an "over-voltage" Vo—is then momentarily applied to the local electrode 102, usually in brief pulses, so that the total applied potential Vs–(Vle+Vo) will induce atoms to "evaporate" from the specimen 10, ideally with a single atom (ion) of the specimen 10 leaving the specimen 10 each time an over-voltage pulse is applied. Additionally or alternatively, momentary heating of the specimen 10 (as with a laser) can be used to induce ion evaporation. The evaporated ions are accelerated towards the local electrode 102 to pass through an aperture defined therein, and then impinge upon the detector 100. Under ordinary test conditions, the evaporated ions from the specimen 10 project onto the detector 100 at positions correlated with their original locations on the specimen 10, and thus the detector 100 provides data regarding the original position of the ions on the specimen 10. Additionally, ion times of flight (as measured between application of the over-voltage pulse Vo and detector impingement) provide information regarding ion masses, and thus their identities. Thus, repeated overvoltage pulsing allows a three-dimensional map of the locations and identities of the atoms of the specimen 10 to be constructed. Further general information may be found, for example, in U.S. Pat. No. 5,440,124; U.S. Pat. No. 5,061,850; International Publication WO 99/14793; and Kelly et al., Ultramicroscopy 62:29–42 (1996).

One performance limitation of atom probes is their ability to distinguish between ions of nearly similar masses. This property, known as mass resolution, limits the ability to accurately identify ions from the specimen, and leads to uncertainty or errors in the compositional analysis provided by atom probes. Mass resolution limitations are a consequence of the probabilistic nature of ionization: the precise moment at which ionization occurs during an overvoltage pulse Vo can vary slightly between pulses, and thus there are limitations in precisely determining the time of evaporation. Additionally, owing to practical limitations and expense, pulsing systems for applying the overvoltage pulse Vo tend to apply a pulse wherein the amplitude of Vo is not constant over the duration of the pulse, and thus the exact escape potential (and thus velocity and time of flight) of an evaporated ion will vary. While these limitations are expected to diminish as the available pulsing electronics grow in quality (and decrease in expense), they nonetheless pose difficulties given the state of the art as of the year 2003. Several strategies have been employed in atom probes to increase mass resolution, and one strategy (noted in some of the foregoing references) is to situate an intermediate electrode 104 closely adjacent to the local electrode 102, and between the local electrode 102 and the detector 100, and to hold it at some constant attractive potential Vi whereby the velocity of evaporated ions will (at least to some extent) be decoupled from the overvoltage pulse Vo used to induce evaporation. One strategy is to hold Vi at the same potential as Vle, thereby decelerating ions by the amount equivalent to Vo from which the velocity variation originates. Alternatively, an accelerating (more attractive) potential can be applied to Vi, increasing the overall velocity of the ions so that the variation in Vo becomes relatively smaller.

Another limitation of atom probes relates to the time and expense of testing, particularly in the time and expense of preparing specimens for analysis. Initially, the specimens being analyzed must generally be carefully prepared by removing portions of the specimen around the area of interest for study, so that the area of interest is at the tip of a needle-shaped specimen (typically less than 100 nm in diameter). The needle shape creates the large electric field conducive for ionization, allowing the atom probe to operate over a more convenient voltage range (and/or allowing use of less complex thermal pulsing systems). Additionally, since the ions from the needle project onto the detector (and generally "spread" onto the detector in accordance with their relative positions along the axis of the specimen and local electrode), the needle shape assists in attaining atomic-scale resolution in position data for detected ions. However, preparation of specimens—forming their areas of interest at the tips of needles—can be time-consuming and expensive, and can also be difficult where specimens are brittle or otherwise difficult to shape (as is often the case with semiconductor wafer-derived specimens).

Additionally, since the atom probe must be located in a vacuum chamber (and the specimen must be cryogenically cooled) for optimal operation, specimen processing can be slowed by the need to load and purge the chamber, and to achieve the desired degree of specimen cooling, before testing each specimen. The "warm-up" time between specimens can be reduced by situating multiple specimens within the chamber at the same time (or by forming multiple microtips in a specimen), and then laterally repositioning the specimen with respect to the local electrode (or vice versa) so that several microtips can be analyzed in sequence without the need for intermediate load/purge/cool steps. However, there is still room for improvement in the speed of specimen throughput.

To compound the foregoing problems, specimens are often tested only to find that the collected data is incomplete, e.g., the data does not fully represent the regions of the specimen of particular interest. As an example, the atom probe may not have been run for long enough that data is collected from the desired depth within the specimen. Data may also be incomplete because a desired feature may rest partially or wholly outside of the field of view of the atom probe, because the ions from the feature had flight paths which did not impinge upon the detector. It is also possible that data from the desired feature may not be collected at the desired magnification: the detector has a limit to how accurately the location of ion impingement may be measured, and thus insufficient spread in ion flight paths may tax the sensitivity of the detector, resulting in "coarse" positional data. To illustrate some of these shortcomings, referring to FIG. 1, the detector 100 is spaced from the local electrode 102 at such a distance that acceptable time-of-flight readings can be made (i.e., so that the desired degree of mass resolution is obtained). Since there are practical limitations on the size of the detector 100 (with larger ones generally being on the order of about 100 mm in diameter as of the year 2003), the detector 100 is generally sized such that it only rests within a portion B of the cone of evaporated ions flying from the specimen 10 (this cone of ions being designated by the reference character A). Since the detector 100 essentially captures a projection of the specimen 10, the portion of the flight cone A intersecting the detector 100 (i.e., flight cone B) defines the field of view captured by the detector 100: as the detector 100 receives more of the flight cone A, the detector 100 will image a greater amount of the specimen 10. If the detector 100 is then positioned at 100A, more distantly from the local electrode 102, it intersects even less of the flight cone A—it receives flight cone C, a subset of the ions of flight cone A—and the field of view is decreased. However, situating the detector at 100A will yield greater magnification, since the ions, when reaching 100A, have greater spread. Additionally, there is some gain in mass resolution (and thus ion identification) owing to the slightly longer time of flight. The more distant detector 100A will also provide a greater depth of analysis within the specimen 10, assuming that a set number of ions will be collected (since detection of some set number of atoms, e.g., $10^6$ atoms, from a smaller area on the specimen 10 necessarily requires collection more deeply within the specimen 10 if the requested number of atoms are to be obtained). The various tradeoffs involved with varying the spacing between the detector 100 and specimen 10 may be summarized as follows:

| Distance | FOV | Magnification | Sampled Depth | Mass Resolution |
|---|---|---|---|---|
| Increases | Decreases | Increases | Increases | Increases |
| Decreases | Increases | Decreases | Decreases | Decreases |

The end result of the foregoing problems is that an experimenter may undergo the time-consuming steps of specimen preparation, atom probe warm-up, and data collection only to find that the data collected has little value: the desired feature is not within the field of view, or has insufficient magnification, or is not sampled to the desired depth, etc. This is particularly problematic where the specimen(s) are rare, expensive, or one-of-a-kind: there may not be a second chance to obtain the desired data.

In view of the foregoing issues, it would be useful to have methods and arrangements available which more readily allow the accurate collection of desired data from atom probe specimens with little or no increase in the burdens of specimen preparation, probe warm-up, and data collection/analysis.

SUMMARY OF THE INVENTION

The invention involves an atom probe which is intended to at least partially solve the aforementioned problems. To give the reader a basic understanding of some of the advantageous features of the invention, following is a brief summary of preferred versions of the atom probe. As this is merely a summary, it should be understood that more details regarding the preferred versions may be found in the Detailed Description set forth elsewhere in this document. The claims set forth at the end of this document then define the various versions of the invention in which exclusive rights are secured.

In preferred versions of the invention, an atom probe includes a specimen mount whereupon a specimen to be analyzed may be situated, wherein the specimen mount is charged to a datum potential. A detector is spaced from the specimen mount, wherein the detector bears an attractive potential with respect to the datum potential whereby any ions from a specimen on the specimen mount are attracted toward the detector. A local electrode is then situated between the specimen mount and detector, with the local electrode also bearing an attractive potential with respect to the datum potential whereby any ions from a specimen on the specimen mount are attracted toward the local electrode. Preferably, at least one of the specimen mount and the detector are movable to adjust the distance between the specimen mount and the detector, whereby the field of view, magnification, and effective sample depth of imaged specimens may be adjusted (and the time of flight of the specimen's ions may be adjusted, thereby adjusting the mass resolution at which these ions may be discerned).

An intermediate electrode is then situated between the local electrode and the detector along the ion flight path between the specimen mount and the detector. This intermediate electrode may serve as a focusing electrode which assists in adjusting field of view and magnification, and/or as a filtering electrode which helps eliminate spurious ions and thereby assists in image data quality. When the intermediate electrode serves as a focusing electrode (as depicted by the focusing electrode 206 in FIG. 2 and the focusing electrode 412 in FIG. 4), its potential is adjusted about the potential of the local electrode (preferably to a potential between that of the local electrode and the detector), whereby the flight path of ions traveling adjacent the first intermediate electrode and between the local electrode and the detector may be adjusted; for example, with reference to FIG. 2, the flight cone may be adjusted from A to the narrower flight cone B, or to the wider flight cone C). As exemplified by the focusing intermediate electrode 412 in FIG. 4, the focusing electrode is preferably also repositionable along the ion flight path between the specimen mount and the detector, and it preferably has a tubular configuration with an interior length oriented along the ion flight path between the specimen mount and the detector, whereby ions traveling from any specimen on the specimen mount to the detector travel through the interior length of the intermediate electrode.

When the intermediate electrode serves as a filtering electrode (as exemplified by the filtering electrode 306 in FIG. 3 and the filtering electrode 408 in FIG. 4), it is preferably charged to a filtering potential which is between the datum potential and the potential of the local electrode, but closer to the datum potential than to the potential of the local electrode (i.e., it has a filtering potential close to the potential of the specimen). This filtering potential may be intermittently applied to the filtering intermediate electrode, as by timing it in accordance with the overvoltage pulses applied to the local electrode. As depicted by the filtering electrode 408 in FIG. 4, it is also useful to have the filtering electrode repositionable between the specimen mount and the detector, since both its charge and location will have an effect on filtration of unwanted ions. It can also be useful to provide radiating members (depicted at 410 in FIG. 4) which extend across the interior of the filtering intermediate electrode, e.g., members formed in a grid/mesh (or other configuration having a large amount of free space for ion flight), so that the filtering electric field emitted by the filtering electrode remains relatively uniform across its aperture.

A particularly preferred arrangement is as depicted in FIG. 4, wherein at least two intermediate electrodes are provided between the local electrode and the detector, wherein at least one serves as a filtering electrode and at least one serves as a focusing electrode. As exemplified in FIG. 4, a focusing intermediate electrode 412 may be provided between a filtering intermediate electrode 408 and the detector 404, wherein the focusing intermediate electrode 412 is charged to a potential between that of the filtering electrode 408 and the detector 404. The intermediate electrodes may be formed in such a manner that one may be received within the interior of the other, and by making either or both of the electrodes movable along the flight path, the relative positions of the electrodes can be readily adapted to provide a variety of focusing and filtering effects (and if desired, the electrodes can be interfit and can cooperate to effectively serve as a single electrode).

Further advantages, features, and objects of the invention will be apparent from the following detailed description of the invention in conjunction with the associated drawings.

BRIEF DESCRIPTION OF THE DRAWINGS

FIG. 3 is a schematic diagram of another exemplary atom probe 300 wherein the intermediate electrode 306 serves as a filtering intermediate electrode for reducing spurious detector readings.

FIG. 4 is a schematic diagram of another exemplary atom probe 400 incorporating both a filtering intermediate electrode 408 and a flight path modification intermediate electrode 412 for adjusting field of view (and thus magnification, sample depth, etc.).

DETAILED DESCRIPTION OF PREFERRED VERSIONS OF THE INVENTION

Figure 2:
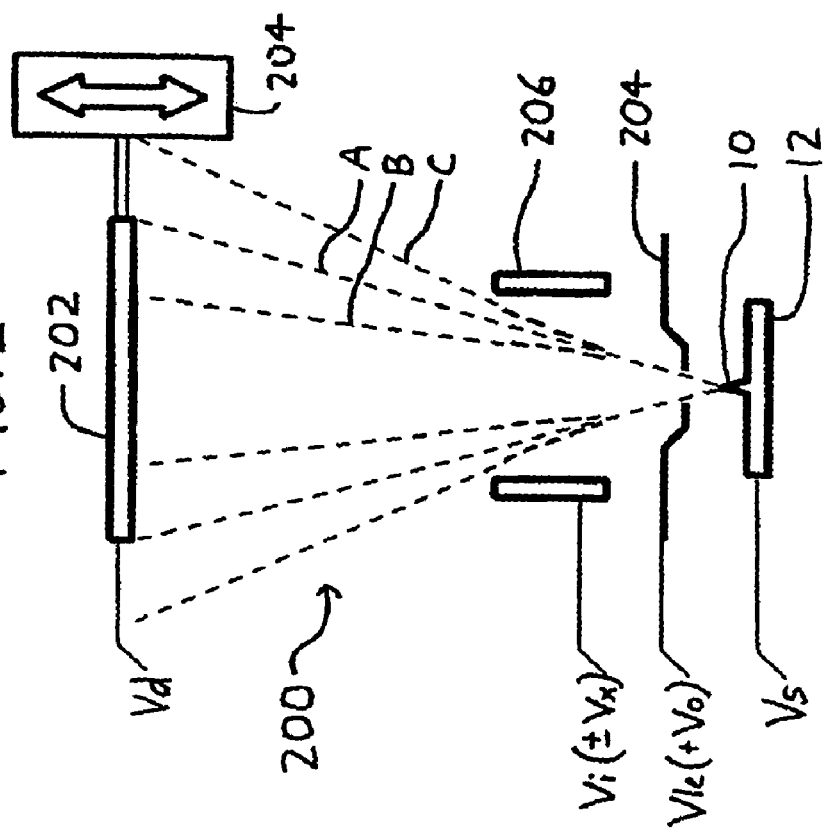
FIG. 2 is a schematic diagram of an exemplary atom probe 200 implementing preferred features of the invention, wherein a tubular intermediate electrode 206 and a repositionable detector 202 are used to modify ion flight paths between flight cones A, B, and C (and thus modify the atom probe's field of view, magnification, sample depth, etc.).

Referring to FIG. 2, an atom probe exemplifying certain preferred features of the invention is designated generally by the reference numeral 200. A specimen 10 is situated on a specimen mount 12, which is charged to a datum potential Vs. A detector 202 is spaced from the specimen 10, and as in prior arrangements, an attractive potential gradient is maintained between the specimen 10, a local electrode 204, and the detector 202: surface atoms on the specimen 10 are ionized by the electric field at the specimen surface as a result of the momentarily applied potential (equal to Vs−(Vle+Vo)), and accelerated towards the local electrode 204 and the detector 202.

The detector 202 is situated on a positioning stage 204 which allows the detector 202 to be repositioned at least along the axis of the flight cone A wherein evaporated ions travel from the specimen 10 when overvoltage pulses Vo are applied to the local electrode 204. Such a positioning stage 204 may take the form of virtually any type of actuator capable of operating within the chamber of the atom probe 200 (or any form of actuator capable of repositioning the detector 202 from outside the chamber via a connecting linkage). Ideally, the positioning stage allows variation of the distance between the specimen and detector by at least 30%, and it is particularly preferred that the specimen-detector distance be variable to allow a flight path between 40–150 mm.

An intermediate electrode 206, preferably having a tubular form with an elongated interior passage oriented concentrically along the axis of the flight cone A, is then situated between the local electrode 204 and the detector 202. The intermediate electrode 206 also bears an attractive potential Vi with respect to the specimen 10. If the potential Vi of the intermediate electrode 206 is set equal to the potential of the local electrode Vle, the ions within the flight cone will experience a modest deceleration (corresponding to Vo) when traveling between the local electrode 204 and the intermediate electrode 206, and the flight cone A should be largely unaltered. However, with appropriate tailoring of the potential Vi applied to the intermediate electrode 206—as by varying it significantly above or below the potential Vle of the local electrode 204—the shape of the flight cone A may be altered to modify the effective field of view captured by the detector 202. If the attractive potential of the intermediate electrode 206 is increased by some potential Vx, ions within the flight cone A will be accelerated as they travel between the local and intermediate electrodes 204 and 206, resulting in an effective narrowing of the flight cone (exemplified by flight cone B) as the forward velocity component of the ions (their velocity towards the detector 292) is increased in comparison to their lateral/radial component of velocity (their velocity outwardly from the axis of the flight cone A). This results in an effective increase in the field of view captured by the detector 202 (assuming its position remains constant), with a corresponding reduction in magnification, and in the depth/volume of the specimen 10 being sampled (assuming that a constant number of ions/atoms are collected). Conversely, if the attractive force is decreased by some potential Vx (i.e., if Vi is positive relative to Vle), the evaporated ions will be decelerated, and the angle of the flight cone A will increase as the forward velocity component of the ions is decreased in comparison to their lateral/radial component of velocity (resulting in a flight cone exemplified by flight cone C). As the flight cone spreads, so does the projection of the specimen 10 on the detector 202, and thus the field of view is decreased (assuming that the detector 202 is maintained in the same position).

The foregoing arrangement therefore allows modification in the field of view captured by the detector 202 (and thus in magnification and sampling depth). Further ability to modify field of view is allowed by additionally providing the detector 202 on the positioning stage 204, since decreasing the distance between the detector 202 and the local electrode 204 will increase field of view (and conversely, more distant spacing decreases field of view). The arrangement therefore allows the detector 202 to be distanced to such a degree that time of flight (and thus mass resolution) are acceptable, with such distancing providing the desired field of view in conjunction with the action of the intermediate electrode 206.

Modification of the flight cone from the typical (unmodified) conical shape A to a modified shape (such as B or C) will require additional analysis of the data generated by the detector 202 in order to properly correlate ion impingement with its location and identity on the specimen 10: whereas the flight cone A results in a fairly straightforward projection of the specimen 10 onto the detector 100, the modified flight cones B and C would, if interpreted in the same way, provide a distorted interpretation of the specimen 10. Stated differently, when the flight cone is modified, the ion impingements on the detector 202 require compensation for the curvature in their paths if they are to be properly correlated with their presence on the specimen 10. Data correction may be affected by applying one (and preferably a combination) of the following methodologies.

First, principles of electrostatics may be used to numerically model the flight path modifications introduced by the intermediate electrode 206, and allow compensation for any changes made to ion flight times and paths.

Second, corrections may also be derived by statistical analysis of collected ion impingement data. Consider, for example, that when the flight cone is spread (i.e., off-axis ions will be pulled further off-axis), the density of ion impingements of ion impingements in the radial direction, outwardly from the center of the flight cone, will generally be reduced from the case of an unspread flight cone. Similarly, when the flight cone is compressed by an accelerating Vi, the density of impingements will be greater towards the edges of the cone as compared to an unspread flight cone. Thus, statistical analysis of the radial variation and density of impingements can assist in providing a spread function which compensates for curvature in flight paths.

Finally, empirical testing can also provide correction functions. By testing specimens with well defined/well known structures (e.g., tungsten crystals), and correlating the distorted image captured by the detector 202 with a modified flight cone B or C to the standard image that would otherwise be collected by a conventional flight cone A, correction functions may be derived to compensate for flight path modifications.

The geometry of the tubular intermediate electrode 206 is an important factor in effecting modification in field of view, and an appropriate shape which will effect the desired spread may be determined by computer modeling and electrostatic analysis. If the intermediate electrode 206 simply takes the form of an apertured plate (or apertured plate-like structure), as in U.S. Pat. No. 5,440,124 and International Publication WO 99/14793, the change in spread of the flight cone will be minor or negligible. A basic version of the intermediate electrode 206 involves a frustoconical tube. It is also generally useful to situate the intermediate electrode 206 as close as possible to the local electrode 204 (with limitations in spacing being largely dependent on the need to electrically isolate the local electrode 204 and the intermediate electrode 206).

Figure 1:
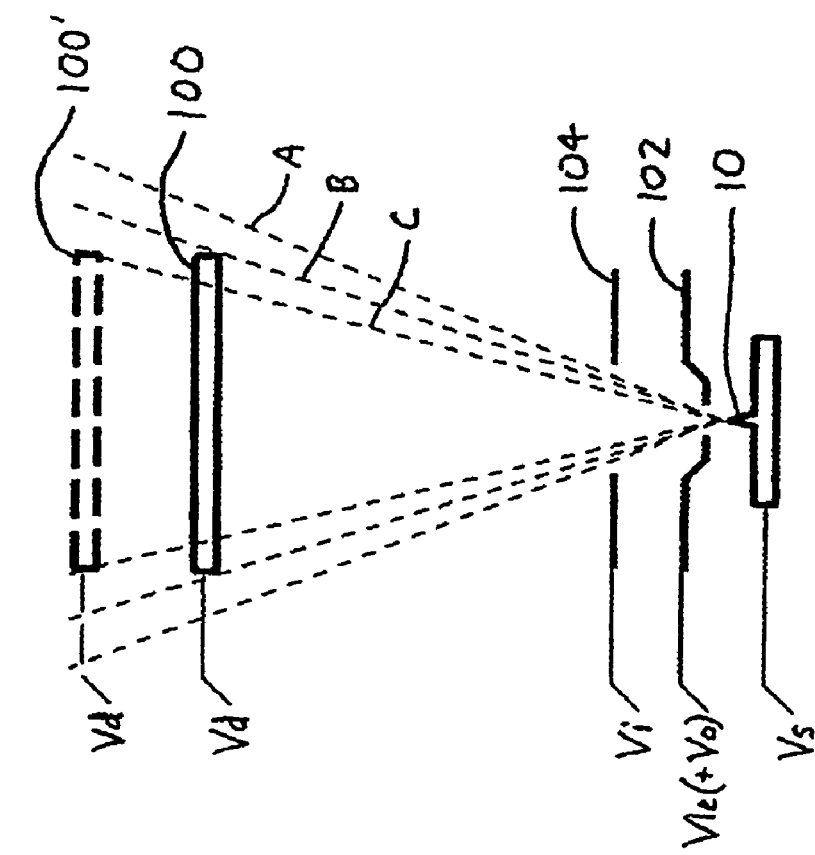
FIG. 1 is a schematic diagram of a conventional atom probe shown in conjunction with an analysis specimen 10, and with the detector of the atom probe illustrated at different locations 100 and 100A.

FIG. 3 then illustrates another exemplary atom probe, which is generally depicted by the reference numeral 300. This version 300 corresponds to conventional arrangements (such as that shown in FIG. 1) in several respects. A specimen 10 is provided on a specimen mount 12, which charges the specimen 10 to some datum potential Vs. A local electrode 302 is charged to some attractive potential Vle (i.e., more negative than a positive Vs), and an overvoltage Vo is then periodically applied to induce ion evaporation from the specimen 10. Evaporated ions impinge on the detector 304 to generate data whereby an image of the specimen 10 may be reconstructed, with time of flight data providing information on ion/atom identity.

An intermediate electrode 306 is also provided, similarly to arrangements such as those in International Publication WO 99/14793 and U.S. Pat. No. 5,440,124. As noted in WO 99/14793 (e.g., at page 7, lines 4–19), such an intermediate electrode 306 may be set at an attractive potential (e.g., Vi=Vle) such that the velocity of ions emitted from the specimen 10 is largely decoupled from the overvoltage pulse Vo. This reduces the spread of ion kinetic energies associated with the time-varying amplitude inherent in the overvoltage pulse Vo.

If operated in the standard arrangement, the atom probe 300 results in a flight cone A incident on the detector 304. However, the intermediate electrode 306 may also be used as a filtering electrode to reduce detection of spurious ions from the specimen 10. Spurious ion emission can occur for several reasons. As one example, ion evaporation from the specimen 10 may occasionally occur in the absence of an overvoltage pulse Vo. As another example, tramp gas—gas remaining in the atom probe chamber after purging—commonly impinges upon the specimen 10, and is then ionized to eject towards the detector 304. These events can cause seemingly erroneous detector readings because the particle strikes on the detector 304 may not be coupled to the timing of overvoltage pulses Vo at the local electrode 302, and thus their true time of flight is uncertain. The impingement of such spurious ions often results in a continuous "noise floor" in the detector data 304 which may obscure the presence of low-concentration species in the specimen 10.

To reduce detection of spurious ions from the specimen 10, the intermediate electrode 306 may be charged such that $0 \leq Vi-Vs < Vle-Vs$, i.e., the intermediate electrode 306 either has a less attractive potential than the local electrode 302 or has a repelling potential. A particularly preferred arrangement is to set the potential Vi of the intermediate electrode 306 at (or about) the specimen potential Vs. Thus, an ion properly evaporated during the application of the overvoltage Vo will have a potential equal to |Vs|+k|Vo| (where k is between 0 and 1, depending on the geometry of the local electrode 302) after leaving the local electrode 302. This ion will be decelerated by the intermediate electrode 306, slowing the ion by an amount corresponding to the potential |Vs|, but will still retain a potential of k|Vo|, allowing it to continue on to the detector 304. Spurious ions do not possess the potential associated with the overvoltage Vo and so leave the specimen 10 with a potential equal to |Vs|. As such ions approach the intermediate electrode 306, they are slowed by the potential |Vo| and will not be able to reach the detector 304.

Turning then to FIG. 4, another exemplary atom probe 400 is shown which in essence combines features of the foregoing versions 200 and 300. As in prior arrangements, the specimen 10 is provided on a specimen mount 12 which charges the specimen 10 to some datum voltage Vs. A local electrode 402 is set at an attractive potential Vle, with a periodic attractive overvoltage Vo being applied to induce sequential evaporation of ions from the specimen 10 towards a detector 404. The detector 404 is connected to a positioning stage 406 to allow some degree of adjustment of its field of view.

A first intermediate electrode 408 is here used as a filtering intermediate electrode which applies a filtering potential (here designated Vf), as in the atom probe 300, to reduce the detection of spurious ions. Whereas the filtering intermediate electrode 306 described with respect to version 300 (FIG. 3) of the invention was depicted as having a conventional apertured plate-like form, the filtering intermediate electrode 408 is here shown as having a frustoconical tubular form with an elongated interior passage oriented along the axis of the (nominal/unaltered) flight cone A. Thus, a possible path for spurious ions rejected by the filtering intermediate electrode 408 is illustrated at B. An enhancement is provided in the form of a screen 410, which extends across the interior passage of the filtering intermediate electrode 408 to better distribute its electric field across the diameter of the flight cone. Such screen preferably takes the form of an electroformed metal mesh, or other radiating members having a high proportion of free space (typically $\geqq 93\%$) in relation to the diameter of its constituent members, whereby ion flight passage is not significantly inhibited.

The filtering potential will also decelerate desired ions, resulting in their spread as shown at C'. This can be corrected by use of a second intermediate electrode 412, which is used as a flight modification intermediate electrode as in the atom probe 200. By applying an appropriate attractive potential Vi at the flight modification intermediate electrode 412, the desired ions can be reaccelerated within the length of the electrode 412 to modify their flight path as shown at C", ultimately resulting in flight cone C. While the second intermediate electrode 412 is depicted as having a tubular geometry of uniform diameter, it too may be formed as a tube having a frustoconical or other shape.

The foregoing uses of the filtering intermediate electrode 408 and/or the flight modification intermediate electrode 412 allow achievement of both of the aforementioned benefits of noise reduction and field of view modification. Since modification of the flight cone (and thus the field of view) will also depend on the location along the flight cone at which flight modification occurs, the intermediate electrodes 412 and 408 may be provided with positioning stages 414 and 416 as well to allow further versatility in field of view modification.

The foregoing version 400 is also beneficial in that either or both of the intermediate electrodes 408 and 412 may be operated as flight modification intermediate electrodes, or as filtering intermediate electrodes, by application of the appropriate constant or periodic potentials to the electrodes. When the intermediate electrodes 408 and 412 are appropriately configured, they may be provided in a telescoping arrangement or other arrangement wherein one of the electrodes is at least partially situated within the other, thereby addressing space issues (particularly where the positioning stage 406 is used) and further enhancing the versatility of the filtration/flight modification effects that can be achieved by the electrodes.

The various preferred versions of the invention are shown and described above to illustrate different possible features of the invention and the varying ways in which these features may be combined. Apart from combining the different features of the foregoing versions in varying ways, other modifications are also considered to be within the scope of the invention. Following is an exemplary list of such modifications.

First, while the intermediate electrode 206 of FIG. 2 was characterized as having a tubular form, this does not require that an intermediate electrode 206 take the form of a circular tube in order to effect changes in field of view. Tubes of other shapes—such as conical tubes, or tubes having other variations in their diameters along their length, or even tubes having non-circular diameters (e.g., polygonal cross-sections)—are possible. However, it must be kept in mind that the complexity of the electric field emitted by the intermediate electrode 206 will generally increase as its shape grows more complex, and this will affect the complexity of the data analysis needed to properly interpret the data from the detector 202.

Second, while the foregoing versions of the invention illustrate atom probes with a single flight path modification intermediate electrode, a single filtering intermediate electrode, or a combination of the foregoing, it should be understood that more than one of either type of electrode may be used. In particular, multiple flight path modification intermediate electrodes arrayed in sequence along a flight path may be useful.

Third, while the foregoing versions of the invention illustrate repositioning of any one or more of the detector, the flight path modification intermediate electrode, and the filtering intermediate electrode, it is also possible to attain further modification of field of view (and of associated properties such as magnification and sampling depth) by repositioning the specimen along the axis of the flight cone. Repositioning of specimens in planes perpendicular to the axis of the flight cone is known (see, e.g., International Publication WO 99/14793 at page 8 lines 16–26); however, as discussed therein (and in U.S. Pat. No. 5,440,124 at column 9 lines 38–44), a more conventional arrangement is to laterally reposition the local electrode, detector, and any intermediate electrodes with respect to the specimen mount. This is owing to practical difficulties in repositioning the specimen, which is generally already repositioned on gimbals (which allow rotation of the specimen to expose desired faces to the local electrode) and which is also generally associated with cryogenic cooling equipment. Owing to the bulk of the gimbals and cooling equipment, it is usually difficult to practically reposition the specimen mount in the lateral planes about the axis of the flight cone. However, such an arrangement is achievable, and it is similarly possible to reposition the specimen mount in directions parallel to the flight cone axis as well.

The invention is not intended to be limited to the preferred versions of the invention described above, but rather is intended to be limited only by the claims set out below. Thus, the invention encompasses all different versions that fall literally or equivalently within the scope of these claims.

What is claimed is:

1. An atom probe comprising:
   a. a specimen mount whereupon a specimen to be analyzed may be situated;
   b. a detector spaced from the specimen mount;
   c. a local electrode situated between the specimen mount and detector;
   d. a filtering electrode situated between the local electrode and the detector;
   wherein:

(1) the local electrode and the detector are each charged to a potential with respect to the specimen mount whereby ions from any specimen provided on the specimen mount are attracted towards the local electrode and the detector, and
(2) the filtering electrode bears a filtering potential with respect to the specimen mount, the filtering potential being closer to the potential of the specimen mount than to the potential of the local electrode.

2. The atom probe of claim 1 wherein the filtering potential is at least substantially equal to the potential of the specimen mount.

3. The atom probe of claim 1 wherein the filtering potential is intermittently applied to the filtering electrode.

4. The atom probe of claim 1 wherein the filtering electrode is tubular, and has an interior length defined therein oriented along an axis between the specimen mount and the detector, wherein ions traveling between any specimen on the specimen mount and the detector travel through the interior length of the filtering electrode.

5. The atom probe of claim 4 wherein the filtering electrode includes one or more radiating members extending across its interior.

6. The atom probe of claim 1 further comprising an intermediate electrode situated adjacent the filtering electrode between the local electrode and the detector, wherein the intermediate electrode is charged to a potential between that of the local electrode and the detector.

7. The atom probe of claim 1 further comprising an intermediate electrode situated between the filtering electrode and the detector, wherein the intermediate electrode is charged to a potential between that of the filtering electrode and the detector.

8. The atom probe of claim 7 wherein the intermediate electrode is charged to a potential with respect to the specimen mount which is at least as great as the potential of the local electrode with respect to the specimen mount.

9. The atom probe of claim 1 further comprising a tubular intermediate electrode adjacent the filtering electrode, the intermediate electrode having an interior length defined therein oriented along an axis between the specimen mount and the detector, wherein ions traveling between any specimen on the specimen mount and the detector travel through the interior length of the intermediate electrode.

10. The atom probe of claim 1 wherein at least one of the specimen mount and the detector are movable to adjust the distance between the specimen mount and the detector.

11. The atom probe of claim 10 wherein the filtering electrode is repositionable between the specimen mount and the detector.

12. The atom probe of claim 11 further comprising an intermediate electrode situated between the local electrode and the detector.

13. The atom probe of claim 12 wherein the intermediate electrode is also repositionable between the specimen mount and the detector.

14. The atom probe of claim 12 wherein one of the intermediate electrode and the filtering electrode is repositionable to at least partially receive the other therein.

15. The atom probe of claim 10 further comprising an intermediate electrode situated between the local electrode and the detector, wherein the intermediate electrode is repositionable between the specimen mount and the detector.

16. The atom probe of claim 15 wherein one of the intermediate electrode and the filtering electrode is repositionable to at least partially receive the other therein.

17. An atom probe comprising:
a. a specimen mount bearing a datum potential;
b. a local electrode spaced from the specimen mount, the local electrode bearing an attractive potential with respect to the datum potential whereby any ions from a specimen on the specimen mount are attracted toward the local electrode;
c. a detector spaced from the local electrode and the specimen mount, the detector bearing an attractive potential with respect to the datum potential whereby any ions from a specimen on the specimen mount are attracted toward the detector;
d. a first intermediate electrode situated between the local electrode and the detector;
wherein at least one of the specimen mount and the detector are movable to adjust the distance between the specimen mount and the detector.

18. The atom probe of claim 17 wherein the first intermediate electrode bears a potential adjustable about the potential of the local electrode, whereby the flight path of ions traveling adjacent the first intermediate electrode and between the local electrode and the detector may be adjusted.

19. The atom probe of claim 17 wherein the first intermediate electrode is a filtering electrode bearing a filtering potential which is:
a. between the datum potential and the potential of the local electrode, and
b. closer to the datum potential than to the potential of the local electrode.

20. The atom probe of claim 17 wherein the filtering potential is at least substantially equal to the datum potential.

21. The atom probe of claim 17 wherein the filtering potential is intermittently applied to the first intermediate electrode.

22. The atom probe of claim 17 wherein the first intermediate electrode has an interior passage with a length extending between the local electrode and the detector.

23. The atom probe of claim 22 wherein the intermediate electrode includes one or more radiating members extending across its interior passage.

24. The atom probe of claim 17 further comprising a second intermediate electrode situated between the local electrode and the detector, wherein the second intermediate electrode bears a potential between that of the filtering electrode and the detector.

25. The atom probe of claim 24 wherein one of the first intermediate electrode and the second intermediate electrode is repositionable to at least partially receive the other therein.

26. The atom probe of claim 17 wherein the intermediate electrode is repositionable between the specimen mount and the detector.

27. An atom probe comprising:
a. a specimen mount bearing a datum potential;
b. a detector spaced from the specimen mount;
c. a local electrode between the specimen mount and the detector;
d. an intermediate electrode situated between the local electrode and the detector;
e. a filtering electrode situated between the local electrode and the detector;
wherein:
(1) the local electrode, intermediate electrode, and filtering electrode are located along an ion flight path between the specimen mount and the detector;

(2) at least one of the specimen mount, the detector, the local electrode, the intermediate electrode, and the filtering electrode are movable along the flight path;

(3) the detector, local electrode, and intermediate electrode each bear an attractive potential with respect to the datum potential, thereby attracting any ions from a specimen on the specimen mount; and (4) the filtering electrode bears a filtering potential closer to the potential of the specimen mount than to the potential of the local electrode.

28. The atom probe of claim 27 wherein one of the intermediate electrode and the filtering electrode is repositionable to at least partially receive the other therein.

29. The atom probe of claim 27 wherein at least one of the intermediate electrode and the filtering electrode is tubular, and includes an interior passage having a length oriented along the ion flight path.

30. The atom probe of claim 27 wherein at least one of the intermediate electrode and the filtering electrode includes:

a. an interior passage oriented along the ion flight path, and b. includes one or more radiating members extending across its interior passage.

* * * * *

UNITED STATES PATENT AND TRADEMARK OFFICE
CERTIFICATE OF CORRECTION

PATENT NO. : 7,157,702 B2 Page 1 of 1
APPLICATION NO. : 10/559733
DATED : January 2, 2007
INVENTOR(S) : Tye Gribb It is certified that error appears in the above-identified patent and that said Letters Patent is hereby corrected as shown below:

<u>Column 6</u>
Line 52, "detector 292" should be --detector 202--;

Signed and Sealed this

Tenth Day of April, 2007

JON W. DUDAS
*Director of the United States Patent and Trademark Office*